United States Patent
Hong et al.

(10) Patent No.: US 9,472,729 B2
(45) Date of Patent: Oct. 18, 2016

(54) METHOD OF MANUFACTURING SEMICONDUCTOR LIGHT EMITTING DEVICE PACKAGE INCLUDING LIGHT TRANSMISSIVE SUBSTRATE HAVING WAVELENGTH CONVERSION REGIONS

(71) Applicant: SAMSUNG ELECTRONICS CO., LTD., Suwon-si (KR)

(72) Inventors: Sung Mok Hong, Osan-si (KR); Joong Kon Son, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/602,357

(22) Filed: Jan. 22, 2015

(65) Prior Publication Data
US 2015/0364639 A1 Dec. 17, 2015

(30) Foreign Application Priority Data
Jun. 16, 2014 (KR) .................. 10-2014-0072864

(51) Int. Cl.
| H01L 21/00 | (2006.01) |
| H01L 33/48 | (2010.01) |
| H01L 23/00 | (2006.01) |
| H01L 33/50 | (2010.01) |

(52) U.S. Cl.
CPC ............ *H01L 33/486* (2013.01); *H01L 24/97* (2013.01); *H01L 33/504* (2013.01); *H01L 33/505* (2013.01); *H01L 2224/16225* (2013.01); *H01L 2933/0033* (2013.01); *H01L 2933/0041* (2013.01)

(58) Field of Classification Search
CPC ........ H01L 21/50; H01L 33/00; H01L 33/50

USPC ............... 438/7, 27, 28; 257/88, E21.499
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |

(Continued)

FOREIGN PATENT DOCUMENTS

WO 2013/029862 A1 3/2013

*Primary Examiner* — Caleb Henry
(74) *Attorney, Agent, or Firm* — Sughrue Mion, PLLC

(57) ABSTRACT

A method of manufacturing a semiconductor light emitting device package includes arranging a plurality of light emitting structures on a support substrate, each light emitting structure including a first conductivity-type semiconductor layer, an active layer and a second conductivity-type semiconductor layer, bonding a light transmissive substrate to the plurality of light emitting structures, the light transmissive substrate having a plurality of wavelength conversion regions corresponding to the plurality of light emitting structures, respectively, removing the support substrate from the plurality of light emitting structures, and separating individual semiconductor light emitting device packages from one another by removing at least a portion of the light transmissive substrate.

12 Claims, 13 Drawing Sheets

(56) References Cited

U.S. PATENT DOCUMENTS

| | | | |
|---|---|---|---|
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,897,419 B2 * | 3/2011 | Donofrio | H01L 33/005 257/88 |
| 7,940,350 B2 | 5/2011 | Jeong | |
| 7,959,312 B2 * | 6/2011 | Yoo | 257/98 |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 * | 9/2011 | Lee | H01L 33/62 257/79 |
| 8,017,417 B1 | 9/2011 | Cho | |
| 8,049,161 B2 | 11/2011 | Sherrer et al. | |
| 8,093,079 B2 | 1/2012 | Kim | |
| 8,129,711 B2 | 3/2012 | Kang et al. | |
| 8,179,938 B2 | 5/2012 | Kim | |
| 8,183,592 B2 * | 5/2012 | Lee | H01L 27/153 257/88 |
| 8,198,380 B2 | 6/2012 | Katayama | |
| 8,263,987 B2 | 9/2012 | Choi et al. | |
| 8,324,646 B2 | 12/2012 | Lee et al. | |
| 8,399,944 B2 * | 3/2013 | Kwak | H01L 33/508 257/103 |
| 8,432,511 B2 | 4/2013 | Jeong | |
| 8,459,832 B2 | 6/2013 | Kim | |
| 8,482,020 B2 | 7/2013 | Xu | |
| 8,502,242 B2 | 8/2013 | Kim | |
| 8,536,604 B2 | 9/2013 | Kwak et al. | |
| 8,629,475 B2 * | 1/2014 | Tischler | H01L 33/50 257/89 |
| 8,735,931 B2 | 5/2014 | Han et al. | |
| 8,766,295 B2 | 7/2014 | Kim | |
| 9,123,871 B1 * | 9/2015 | Cha | H01L 33/486 |
| 2002/0028527 A1 * | 3/2002 | Maeda | H01L 25/167 438/29 |
| 2002/0076701 A1 | 6/2002 | Neriishi et al. | |
| 2005/0077531 A1 * | 4/2005 | Kim | H01L 33/505 257/98 |
| 2005/0274970 A1 * | 12/2005 | Ludowise | H01L 33/62 257/99 |
| 2006/0044864 A1 * | 3/2006 | Lin | H01L 25/0753 365/151 |
| 2006/0163596 A1 * | 7/2006 | Kim | G02F 1/133603 257/98 |
| 2008/0179611 A1 * | 7/2008 | Chitnis | H01L 33/508 257/98 |
| 2009/0267085 A1 * | 10/2009 | Lee | F21K 9/00 257/88 |
| 2010/0072905 A1 * | 3/2010 | Kim | H05B 33/0821 315/192 |
| 2010/0081218 A1 * | 4/2010 | Hardin | H01L 33/508 438/7 |
| 2010/0109025 A1 * | 5/2010 | Bhat | H01L 24/97 257/88 |
| 2010/0117099 A1 | 5/2010 | Leung | |
| 2012/0091481 A1 * | 4/2012 | Sekine | H01L 33/486 257/88 |
| 2013/0187174 A1 * | 7/2013 | Tischler | H01L 33/50 257/80 |
| 2013/0187540 A1 | 7/2013 | Tischler | |
| 2014/0054616 A1 * | 2/2014 | Tseng | H01L 33/62 257/88 |

\* cited by examiner

›
FIG. 17A
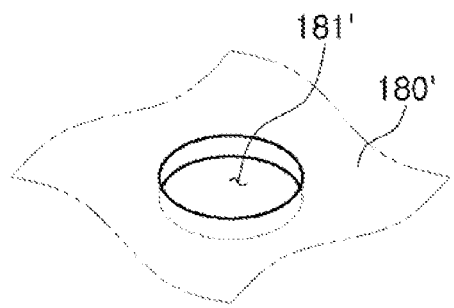
FIG. 17B
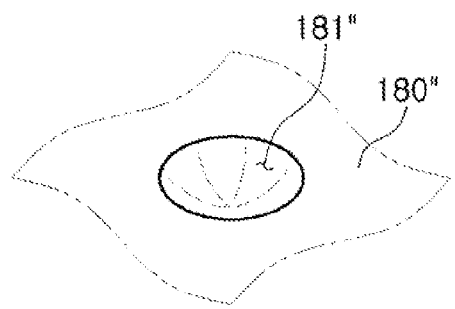
FIG. 17C
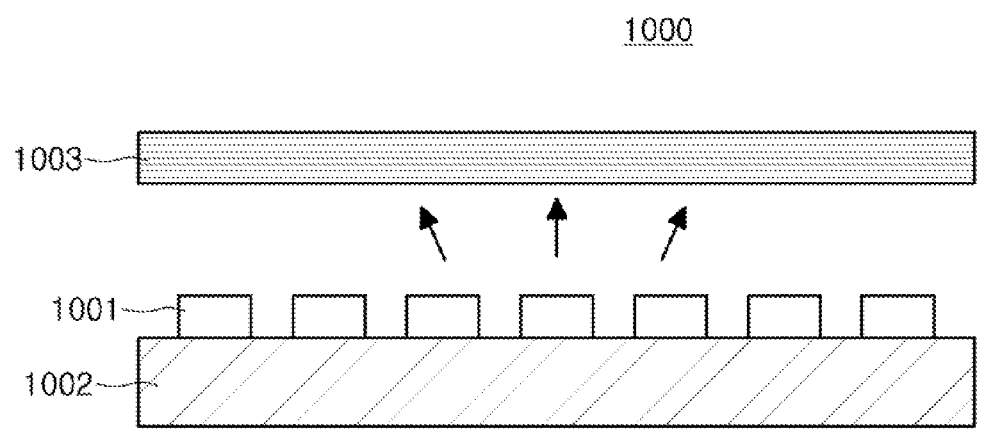
FIG. 18

METHOD OF MANUFACTURING SEMICONDUCTOR LIGHT EMITTING DEVICE PACKAGE INCLUDING LIGHT TRANSMISSIVE SUBSTRATE HAVING WAVELENGTH CONVERSION REGIONS

CROSS-REFERENCE TO RELATED APPLICATION

This application claims the priority of Korean Patent Application No. 10-2014-0072864 filed on Jun. 16, 2014, with the Korean Intellectual Property Office, the disclosure of which is incorporated herein by reference in its entirety.

TECHNICAL FIELD

The present disclosure relates to a method of manufacturing a semiconductor light emitting device package.

DISCUSSION OF RELATED ART

A light emitting diode (LED) is a device including a material that emits light through the application of electrical energy thereto, in which energy generated by electron-hole recombination in semiconductor junction parts is converted into light to be emitted therefrom. LEDs can be employed as light sources in general lighting devices, display devices, and the like.

SUMMARY

According to an exemplary embodiment in the present disclosure, a method of manufacturing a semiconductor light emitting device package may include arranging a plurality of light emitting structures on a support substrate, each light emitting structure including a first conductivity-type semiconductor layer, an active layer and a second conductivity-type semiconductor layer; bonding a light transmissive substrate to the plurality of light emitting structures, the light transmissive substrate having a plurality of wavelength conversion regions corresponding to the plurality of light emitting structures, respectively, removing the support substrate, and removing at least a portion of the light transmissive substrate and separating individual semiconductor light emitting device packages from one another.

The plurality of wavelength conversion regions may be formed by forming recesses in a surface of the light transmissive substrate in positions corresponding to positions of the plurality of light emitting structures and filling the recesses with a wavelength conversion material.

The recesses may be a polygonal cylindrical shape, a cylindrical shape, or a concave lens shape.

The light transmissive substrate may be thicker than one of the light emitting structures.

The light transmissive substrate may include SiO2.

The wavelength conversion regions may be formed by injecting a mixture including phosphor mixed with SiO2 particles into the recesses and sintering the mixture.

The method may further include measuring color characteristics of light emitted from the plurality of light emitting structures prior to performing the arranging of the plurality of light emitting structures on the support substrate.

The method may further include determining a type and an amount of a wavelength conversion material required for color compensation of the plurality of light emitting structures based on a difference between the measured color characteristics and target color characteristics and forming the plurality of wavelength conversion regions in the light transmissive substrate based on the determined type and the determined amount of the wavelength conversion material, prior to performing the bonding of the light transmissive substrate to the plurality of light emitting structures.

The method may further include measuring color characteristics of light emitted from the plurality of light emitting structures prior to performing the separating of the individual semiconductor light emitting device packages from one another.

The method may further include determining a type and an amount of a wavelength conversion material required for color compensation of the light emitting structures based on a difference between the measured color characteristics and target color characteristics and forming additional wavelength conversion regions on the light transmissive substrate based on the determined type and the determined amount of the wavelength conversion material, prior to performing the separating of the individual semiconductor light emitting device packages from one another.

The forming of the additional wavelength conversion regions may include bonding a secondary light transmissive substrate having the additional wavelength conversion regions to the light transmissive substrate.

The arranging of the plurality of light emitting structures on the support substrate may include: forming the plurality of light emitting structures on a growth substrate; forming first and second electrodes on a first surface of each light emitting structure corresponding to a surface of the second conductivity-type semiconductor layer, the first and second electrodes being connected to the first and second conductivity-type semiconductor layers, respectively; bonding the support substrate to the first surface of the plurality of light emitting structures; and removing the growth substrate from the plurality of light emitting structures.

The method may further include bonding a package substrate to the first surface of the light emitting structure prior to performing the bonding of the support substrate, the package substrate having first and second via electrodes corresponding to the first and second electrodes, respectively.

The arranging of the plurality of light emitting structures on the support substrate may include: growing the plurality of light emitting structures on the support substrate; and removing at least a portion of the light emitting structures and dividing the plurality of light emitting structures into individual light emitting structures.

According to an exemplary embodiment in the present disclosure, a method of manufacturing a semiconductor light emitting device package may include forming a plurality of light emitting structures on a growth substrate, each light emitting structure including a first conductivity-type semiconductor layer, an active layer and a second conductivity-type semiconductor layer; bonding a light transmissive substrate to the plurality of light emitting structures; removing the growth substrate from the plurality of light emitting structures, forming first and second electrodes to be connected to the first and second conductivity-type semiconductor layers, respectively, and bonding a package substrate having first and second electrode structures connected to the first and second electrodes, respectively.

According to an exemplary embodiment in the present disclosure, a method of manufacturing a semiconductor light emitting device package may include arranging a plurality of light emitting structures on a support substrate, each light emitting structure including a first conductivity-type semi-conductor layer, an active layer and a second conductivity-type semiconductor layer, bonding one surface of a light transmissive substrate to the plurality of light emitting structures, the light transmissive substrate having a plurality of wavelength conversion regions corresponding to the plurality of light emitting structures, respectively; removing the support substrate, and cutting the light transmissive substrate to separate individual semiconductor light emitting device packages from one another.

The cutting of the light transmissive substrate to separate the individual semiconductor light emitting device packages from one another may be performed using a laser beam.

The method may further include micromachining the other surface of the light transmissive substrate opposing the one surface thereof on which the plurality of light emitting structures are bonded by using a chemical mechanical polishing (CMP) method prior to performing the cutting of the light transmissive substrate to separate the individual semiconductor light emitting device packages from one another.

The method may further include forming an uneven structure on the light transmissive substrate.

The bonding of the light transmissive substrate may be performed by applying water glass or silicone to the plurality of light emitting structures and heating the plurality of light emitting structures with the water glass or silicone applied thereto.

BRIEF DESCRIPTION OF DRAWINGS

The above and other aspects, features and advantages in the present disclosure will be more clearly understood from the following detailed description taken in conjunction with the accompanying drawings, in which:

FIGS. 17A, 17B and 17C are views of examples of recesses formed in the light transmissive substrate;

FIGS. 18 and 19 illustrate examples of a backlight unit to which a semiconductor light emitting device package according to an exemplary embodiment in the present disclosure is applied;

DETAILED DESCRIPTION

Figure 1A:
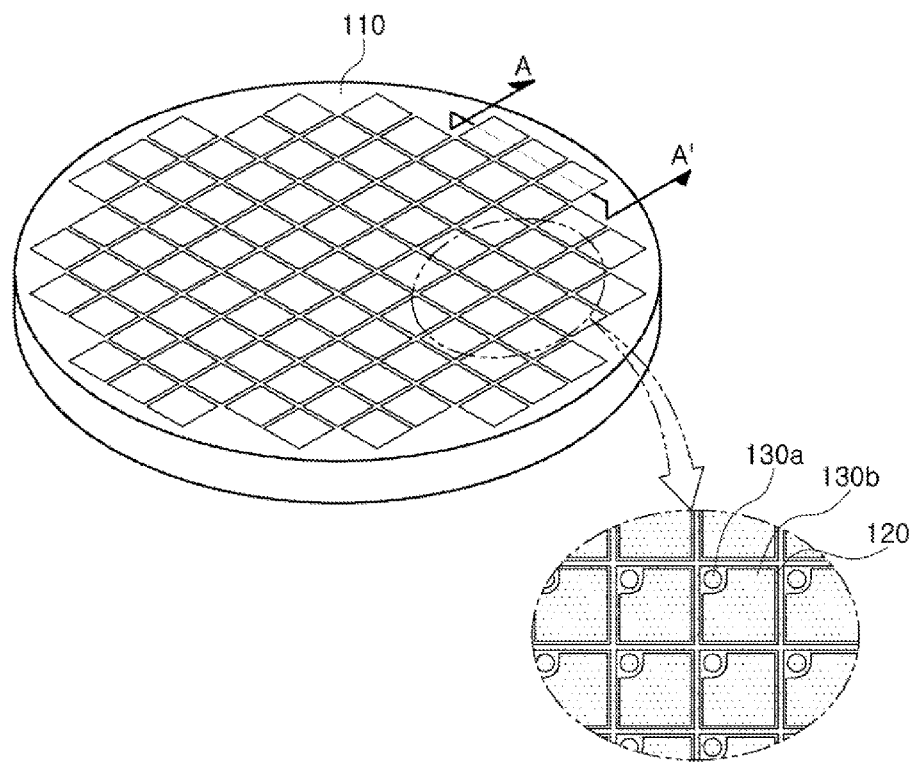
FIGS. 1A, 1B, 2, 3, 4, 5 and 6 are schematic views illustrating sequential processes in a method of manufacturing a semiconductor light emitting device package according to an exemplary embodiment in the present disclosure.
Figure 1B:
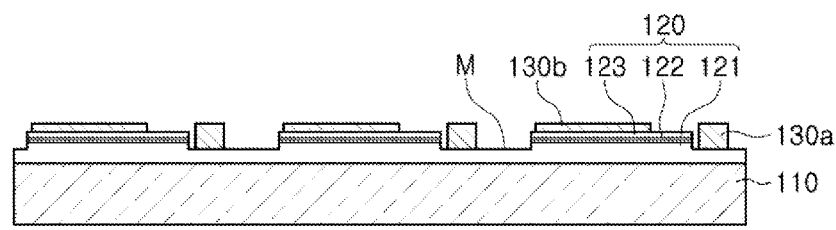

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In the present specification, terms such as "top," "top surface," "bottom," "bottom surface," "side (or lateral) surface," and the like, are determined based on the drawings, and in actuality, the terms may be changed according to a direction in which a device or a package is disposed.

FIGS. 1A through 6 are schematic views illustrating sequential processes in a method of manufacturing a semiconductor light emitting device package according to an exemplary embodiment in the present disclosure. FIG. 1A illustrates that a light emitting structure 120 is formed on a growth substrate 110, and FIG. 1B is a cross-sectional view taken along the line A-A' of FIG. 1A.

A semiconductor light emitting device package 100 according to an exemplary embodiment may be a chip scale package (CSP) or a wafer level package (WLP).

Referring to FIG. 1A, a light emitting structure 120 including a first conductivity-type semiconductor layer 121, an active layer 122 and a second conductivity-type semiconductor layer 123 may be formed on the growth substrate 110.

The growth substrate 110 may be provided as a substrate for semiconductor growth, and may be formed of an insulating, conductive or semiconductor material, such as sapphire, SiC, MgAl2O4, MgO, LiAlO2, LiGaO2, GaN or the like. A sapphire substrate comprises a crystal having Hexa-Rhombo R3C symmetry. The sapphire substrate has a lattice constant of 13.001 Å along a C-axis and a lattice constant of 4.758 Å along an A-axis and includes a C (0001) plane, an A (11-20) plane, an R (1-102) plane, and the like. The C plane is mainly used as a substrate for nitride semiconductor growth because it facilitates the growth of a nitride film and is stable at high temperatures. When an Si substrate is used as the growth substrate 110, the Si substrate may be easily formed to have a large diameter. In an embodiment, a buffer layer may be further formed on a surface of the growth substrate 110 on which the first conductivity-type semiconductor layer 121 is to be formed prior to forming the light emitting structure 120.

The light emitting structure 120 may be formed by sequentially stacking the first conductivity-type semiconductor layer 121, the active layer 122 and the second conductivity-type semiconductor layer 123 on the growth substrate 110.

The first and second conductivity-type semiconductor layers 121 and 123 may be formed of a nitride semiconductor material having a composition of $Al_xIn_yGa_{(1-x-y)}N$ (where $0 \leq x < 1$, $0 \leq y < 1$, and $0 \leq x+y < 1$) and doped with n-type and p-type impurities, respectively. Representative semiconductor materials may include GaN, AlGaN, and InGaN. The n-type impurities may be at least one of Si, Ge, Se, or Te, and the p-type impurities may be at least one of Mg, Zn, or Be. The first and second conductivity-type semiconductor layers 121 and 123 may be grown using metal organic chemical vapor deposition (MOCVD), hydride vapor phase epitaxy (HVPE), molecular beam epitaxy (MBE), or the like. In an exemplary embodiment, the first and second conductivity-type semiconductor layers 121 and 123 may be formed of GaN, and may be formed on the growth substrate 110. The growth substrate 110 may be formed of Si.

A mesa-etched surface M may be formed in a region of the light emitting structure 120. The region of the first conductivity-type semiconductor layer 121 exposed through a mesa-etching process may be used as a device isolation region. The mesa-etched surface M may be formed by an appropriate etching process known in the art such as, for example, inductive coupled plasma reactive ion etching (ICP-RIE).

First and second electrodes 130a and 130b may be formed on the first and second conductivity-type semiconductor layers 121 and 123, respectively. In an embodiment, the first electrodes 130a may be disposed on the mesa-etched surface M of the first conductivity-type semiconductor layer 121 exposed by etching a portion of the light emitting structure 120. The first and second electrodes 130a and 130b may be disposed to expose surfaces thereof to which a package substrate 140 is bonded in a subsequent process. The first and second electrodes 130a and 130b may have different shapes and may be spaced apart from each other, and the shapes and arrangements thereof are not limited to those illustrated in FIG. 1B.

The first and second electrodes 130a and 130b may include Ag, Ni, Al, Rh, Pd, Ir, Ru, Mg, Zn, Pt, Au or the like, and may have a two (or more)-layer structure formed of Ni/Ag, Zn/Ag, Ni/Al, Zn/Al, Pd/Ag, Pd/Al, Ir/Ag. Ir/Au, Pt/Ag, Pt/Al, Ni/Ag/Pt or the like.

In an embodiment, the other surface of the growth substrate 110 opposing one surface thereof on which the light emitting structure 120 is grown may be processed through micromachining using a chemical mechanical polishing (CMP) method, thereby thinning the growth substrate 110. In an embodiment, the CMP method is performed for planarization of a surface of an object through a combination of chemical and mechanical actions. A portion of the other surface of the growth substrate 110 may be chemically etched or the process of thinning the growth substrate 110 may be omitted if the growth substrate is sufficiently thin.

An oxide film may be formed on the light emitting structure 120 to cover the first and second electrodes 130a and 130b and a surface of the oxide film may be flattened, such that the bonding of the package substrate 140 may be further facilitated in a subsequent process.

Figure 2:
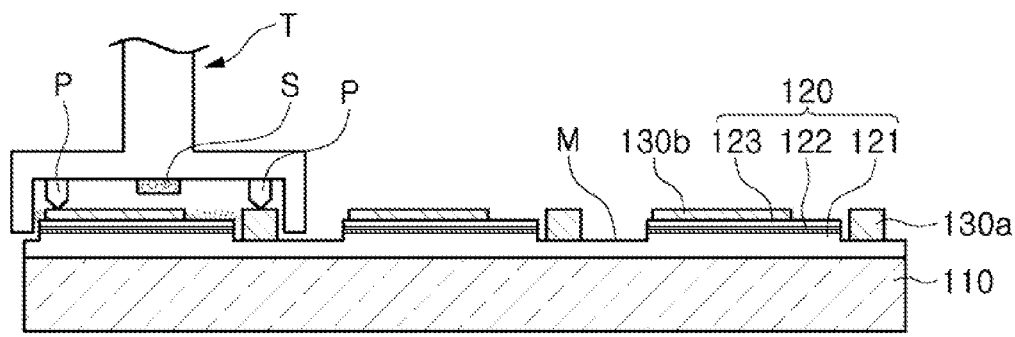

Referring to FIG. 2, the color characteristics of the plurality of light emitting structures 120 may be measured. The color characteristics may be measured using a method of applying power to individual light emitting structures 120 and measuring light emitted from the light emitting structures 120.

The power may be applied to the first and second electrodes 130a and 130b of the light emitting structures 120 using a probe P, and the emitted light may be measured through a light receiving sensor S. The probe P and the light receiving sensor S may be provided as separate devices, or may be included in a single measuring device T.

The color characteristics may be at least one of wavelength, power, full width at half maximum (FWHM) and color coordinates of light emitted from the light emitting structures 120. In an exemplary embodiment, an average wavelength of light emitted from the light emitting structures 120 may be measured.

Various methods for measuring the color characteristics, such as a method of irradiating ultraviolet light or a laser beam onto the surfaces of the light emitting structures 120 and measuring light reflected from the surfaces, may be used.

The growth of the plurality of light emitting structures to be manufactured on a single wafer may be different due to differences in temperature, supply gas flow, and the like, during the manufacturing processes. According to an embodiment, they differ in terms of a wavelength of light, an amount of light, and the like.

Figure 3:
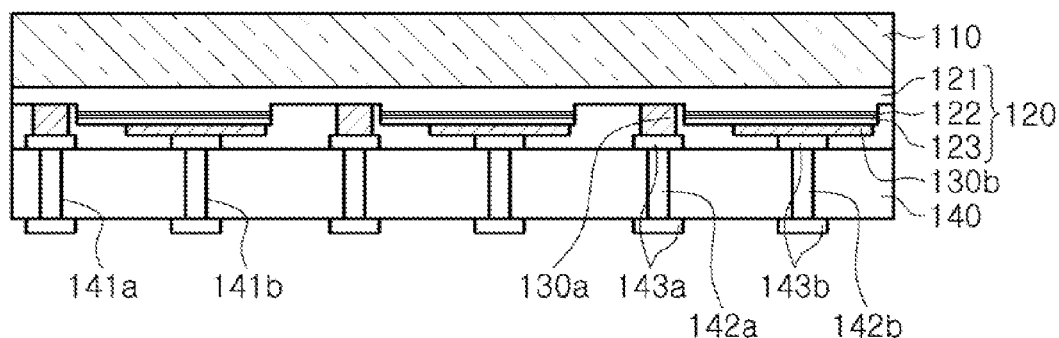

Thereafter, as illustrated in FIG. 3, the package substrate 140 may be bonded to the light emitting structures 120.

First and second bonding pads 143a and 143b may be formed on the package substrate 140. By electrically connecting the first and second electrodes 130a and 130b to the first and second bonding pads 143a and 143b, the light emitting structures 120 may be mounted on the package substrate 140. The first and second electrodes 130a and 130b may be electrically connected to the first and second bonding pads 143a and 143b using a conductive adhesive such as solder bumps or the like, but the connections thereof are not limited thereto.

First and second via electrodes 142a and 142b may be formed to penetrate through the package substrate 140 from one surface of the package substrate 140 to the other surface thereof in a thickness direction, thereby making electrical connections with the first and second electrodes 130a and 130b.

The first and second via electrodes 142a and 142b may be formed by bonding the package substrate 140 to the light emitting structures 120, forming first and second via holes 141a and 141b penetrating through one surface and the other surface of the package substrate 140, and filling the first and second via holes 141a and 141b with a conductive paste. Alternatively, the first and second via electrodes 142a and 142b may be formed by plating the first and second via holes 141a and 141b with a conductive material. However, the formation of the first and second via electrodes is not limited thereto, and the first and second via electrodes 142a and 142b may be formed and bonded prior to bonding the package substrate 140 to the light emitting structures 120.

The first and second bonding pads 143a and 143b may be disposed on one surface and the other surface of the package substrate 140 to which both ends of the first and second via electrodes 142a and 142b are exposed, such that both surfaces of the package substrate 140 may be electrically connected to each other. The package substrate 140 may be a substrate for manufacturing CSPs or WLPs in which packages are completely formed on the wafer level.

The package substrate 140 may be a substrate formed of Si, sapphire, ZnO, GaAs, SiC, MgAl2O4, MgO, LiAlO2, LiGaO2, GaN or the like. In an exemplary embodiment, an Si substrate may be used. However, a material for the package substrate 140 is not limited thereto. Depending on heat dissipation properties and electrical connections of semiconductor light emitting device packages manufactured by mounting the light emitting structures 120 on the package substrate 140, the package substrate 140 may be formed of an organic resin material containing epoxy, triazine, silicone, polyimide, or the like, or another organic resin material. To improve the heat dissipation properties and light emitting efficiency, the package substrate 140 may be formed of a ceramic material having high heat resistance, superior thermal conductivity, high reflective efficiency, and the like. For example, Al2O3, AlN, or the like, may be used.

Besides the aforementioned substrate, a printed circuit board, a lead frame, or the like may be used for the package substrate 140 in an exemplary embodiment.

Figure 4:
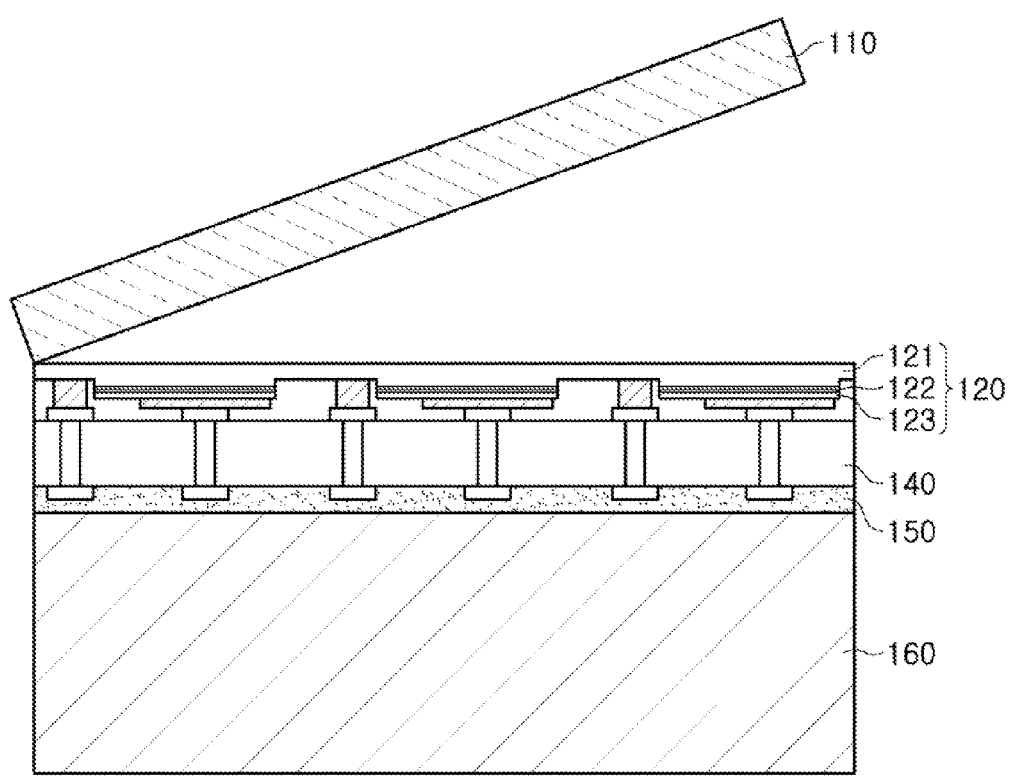

Referring to FIG. 4, a support substrate 160 may be bonded to the bottom of the package substrate 140, and the growth substrate 110 may be removed. Prior to the bonding of the support substrate 160, an adhesive 150 may be applied to the bottom of the package substrate 140. The support substrate 160 may be provided as a support body for preventing the light emitting structures 120 from being damaged in subsequent manufacturing processes, and various types of substrate may be bonded. In an exemplary embodiment, an Si substrate may be bonded.

The support substrate 160 may serve as a support body supporting the light emitting structures 120 in a process for separating the growth substrate 110 from the light emitting structures 120, and thus, after the support substrate 160 is bonded, the growth substrate 110 may be separated from the light emitting structures 120.

The growth substrate 110 may be separated from the light emitting structures 120 through a laser lift off (LLO) process. Here, a laser used in the LLO process may be at least one of an excimer laser having a wavelength of 193 nm, 248 nm, or 308 nm, a Nd:YAG laser, a He—Ne laser, and an argon (Ar) ion laser.

In an embodiment, the growth substrate 110 may be removed by a physical method such as grinding, polishing, lapping, or the like.

Figure 5:
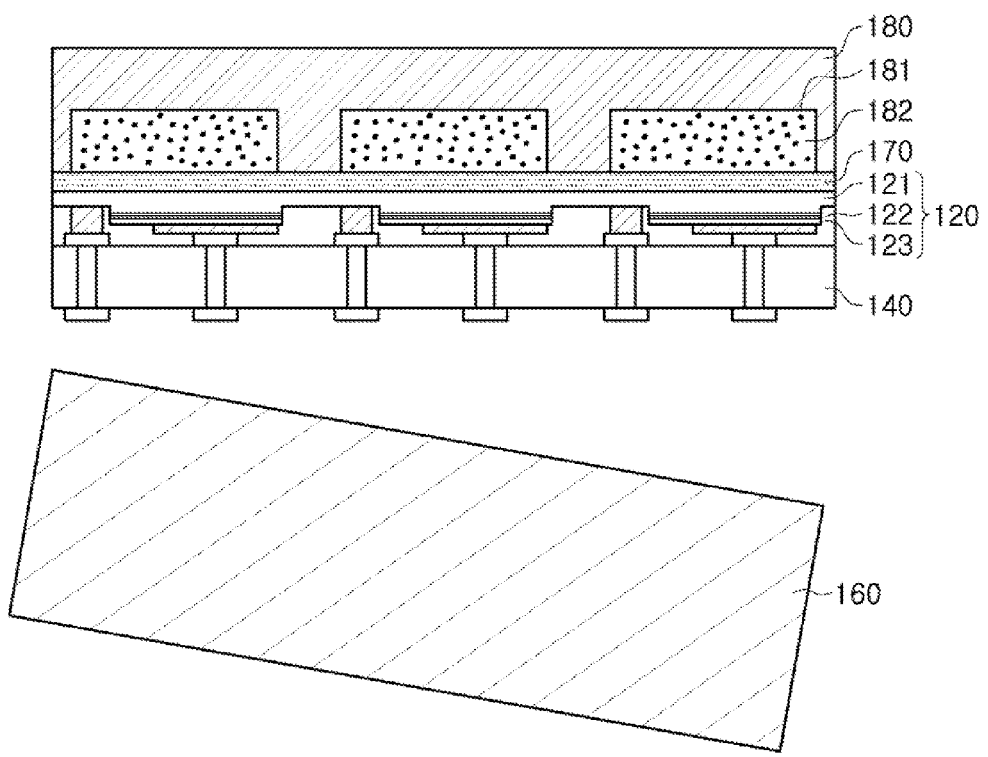

Referring to FIG. 5, a light transmissive substrate 180 having a plurality of wavelength conversion regions 182 may be bonded to portions of the light emitting structures 120 exposed after the growth substrate 110 is removed, and then the support substrate 160 bonded in the previous process may be separated by using the light transmissive substrate 180 as a support body.

Figure 14:
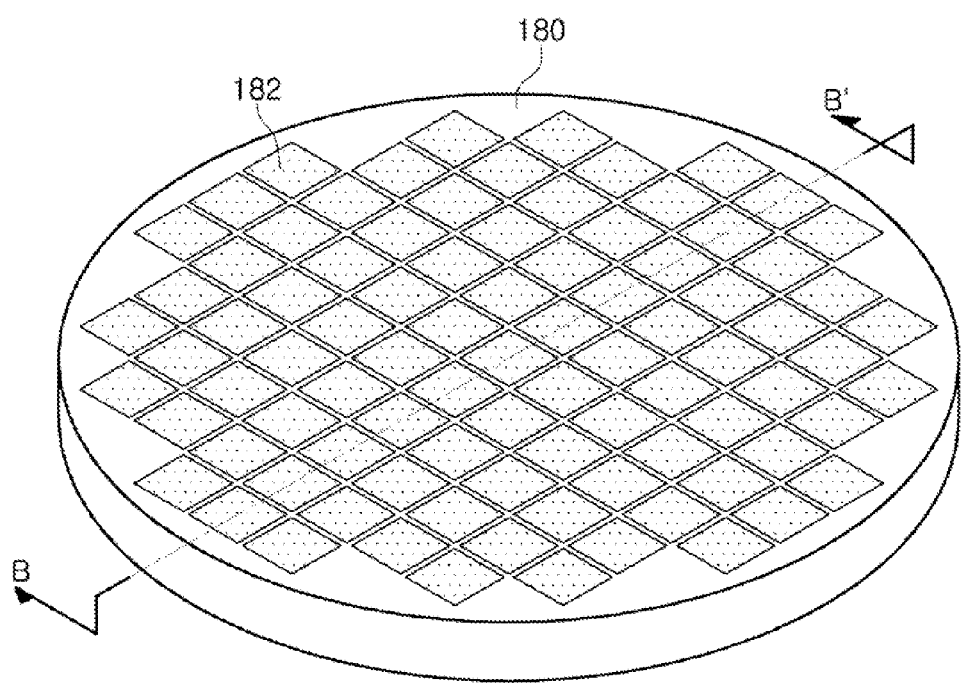
FIG. 14 is a view of a light transmissive substrate of FIG. 5.
Figure 15:
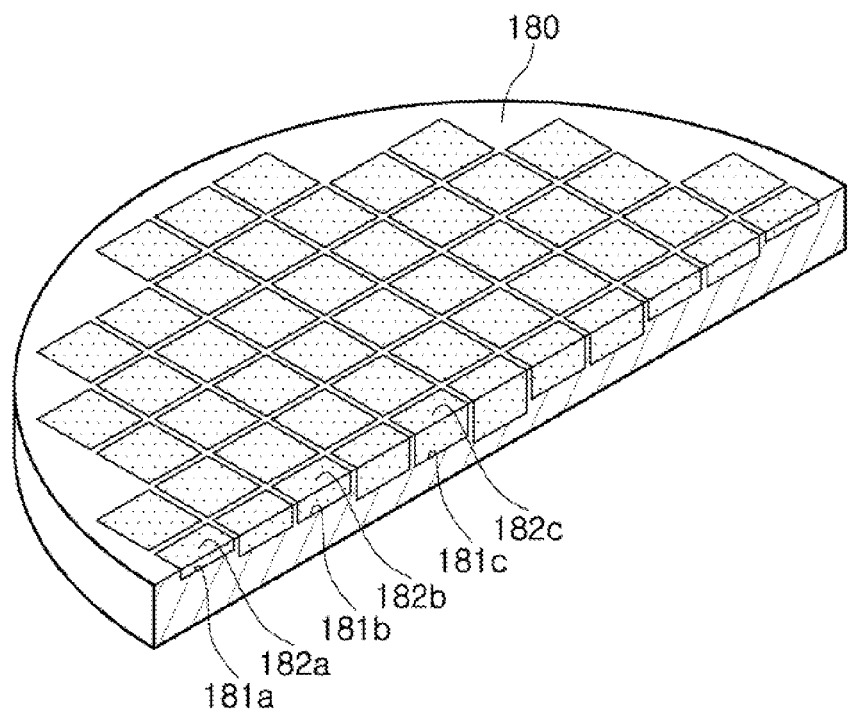
FIG. 15 is a cross-sectional view of a light transmissive substrate of FIG. 14, taken along the line B-B'.
Figure 16:
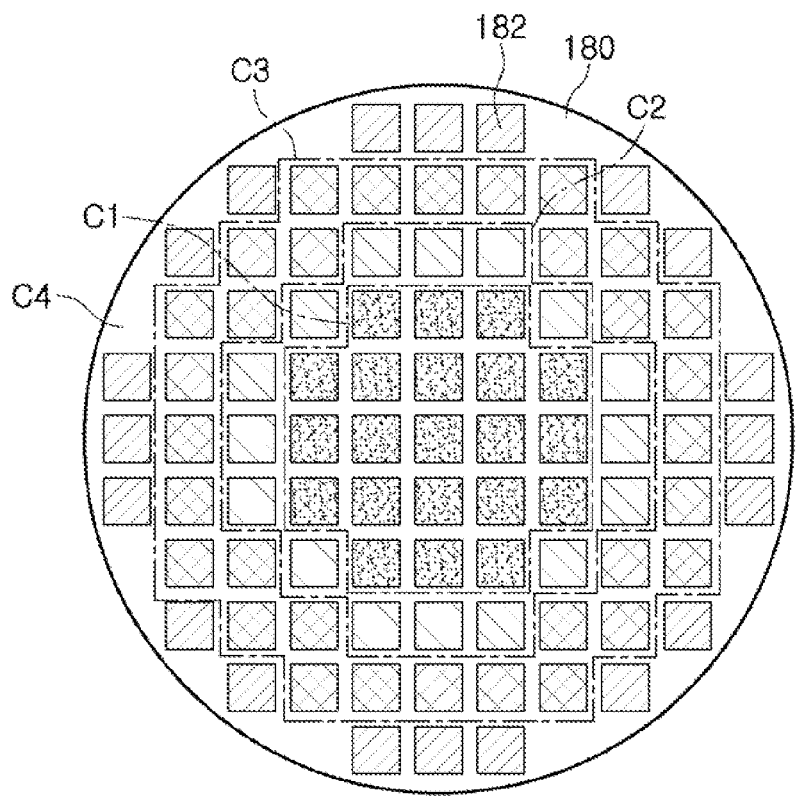
FIG. 16 is a view illustrating the arrangement of wavelength conversion regions on the light transmissive substrate.

FIG. 14 is a view of the light transmissive substrate of FIG. 5, and FIG. 15 is a side cross-sectional view of the light transmissive substrate of FIG. 14 taken along line B-B'. FIG. 16 illustrates the arrangement of the wavelength conversion regions on the light transmissive substrate, and FIGS. 17A through 17C are views of modified examples of recesses formed in the light transmissive substrate.

The light transmissive substrate 180 may be formed of a transparent material, and any material may be used therefor so long as it has a degree of hardness sufficient to securely support the light emitting structures 120 during the separation of the support substrate 160. For example, the light transmissive substrate 180 may be formed of a light-transmissive insulating material, and may be formed of at least one of glass, quartz, transparent resin, SiO2, SiNx, Al2O3, HfO, TiO2 and ZrO.

When the light transmissive substrate 180 is formed of glass, it may be formed of a glass material which is not melted even at high temperatures, such as Pyrex®, Zerodur®, or the like.

The light transmissive substrate 180 may be a plate-like substrate having one surface and the other surface opposing each other, and may have the form of a wafer as illustrated in FIG. 14. The light transmissive substrate 180 may be formed of an insulating material as described above, and may be formed to have a thickness of about 10 µm to about 500 µm.

The bonding of the light transmissive substrate 180 may be performed by applying a light transmissive adhesive 170 such as water glass or silicone to the exposed surfaces of the light emitting structures 120 and heating the same at a temperature of approximately 400° C. or below. In an embodiment, the bonding of the light transmissive substrate 180 may be performed through anodic bonding or fusion bonding at a temperature of approximately 400° C. or below. When the light transmissive substrate 180 is bonded at a relatively low temperature of 400° C. or below, damage to the light emitting structures 120 that may be caused by heat when the light transmissive substrate is bonded at a relatively high temperature may be reduced.

The light transmissive substrate 180 may have the wavelength conversion regions 182 in positions corresponding to those of the light emitting structures 120. The wavelength conversion regions 182 may be formed to be exposed to a surface of the light transmissive substrate 180 in contact with the light emitting structures 120, but the arrangement thereof is not limited thereto. The wavelength conversion regions 182 may be disposed inside the light transmissive substrate 180.

The wavelength conversion regions 182 may be obtained by forming a plurality of recesses 181 in one surface of the light transmissive substrate 180 and filing the recess 181 with a wavelength conversion material.

The plurality of recesses 181 may be formed to have a predetermined depth in positions corresponding to those of the light emitting structures 120, respectively. The recess 181 may have various shapes. For example, referring to FIG. 17A, when viewed from the top of the light transmissive substrate 180, the recess 181 may be a quadrangular cylindrical shape. Referring to FIG. 17B, when viewed from the top of a light transmissive substrate 180', a recess 181' may be a cylindrical shape. Furthermore, as illustrated in FIG. 17C, when viewed from the top of a light transmissive substrate 180", a recess 181" may be formed to have a concave lens shape.

The plurality of recesses 181 may be formed to have the same depth or different depths. Referring to FIG. 15, a plurality of recesses 181a, 181b, and 181c may be formed to have different depths according to regions. The depths thereof may be varied according to the measured color characteristics of the plurality of light emitting structures 120 obtained in the previous measuring operation. The shapes of the wavelength conversion regions 182a, 182b, and 182c formed in the light transmissive substrate 180 may be varied by adjusting the shape of the recess 181.

The wavelength conversion material may be a material in which at least one type of a phosphor, a quantum dot, or the like, is dispersed in a silicone resin or the like. In an embodiment, the phosphor or the quantum dot may be dispersed in a material having the same composition as that of the light transmissive substrate 180, or may be mixed with a material having the same composition as that of the light transmissive substrate 180.

The wavelength conversion regions 182 may be formed by filling the plurality of recesses 181 formed in the light transmissive substrate 180 with the wavelength conversion material and curing the wavelength conversion material. In an embodiment, the wavelength conversion regions 182 may be formed by mixing the phosphor or the quantum dot with a material such as silicone, filling the recesses 181 with the mixture, and heat-curing the mixture. In an embodiment, the wavelength conversion regions 182 may be formed by mixing the phosphor or the quantum dot with glass particles, filling recesses of the light transmissive substrate 180 formed of glass with the mixture, and sintering the mixture.

The plurality of recesses 181 may be filled with the same type and the same amount of the wavelength conversion material. Alternatively, a type and an amount of a wavelength conversion material filling individual recesses 181 may be changed according to the measured color characteristics of the plurality of light emitting structures 120 obtained in the previous measuring operation. The recesses 181 may be grouped according to positions thereof, each group of which may be filled with the same type and the same amount of the wavelength conversion material.

The process of forming the wavelength conversion regions 182 according to the measured color characteristics of the plurality of light emitting structures 120 obtained in the measuring operation will be detailed below.

A type and an amount of a wavelength conversion material required for color compensation of the light emitting structures 120 may be determined based on a difference between the previously measured color characteristics and color characteristics targeted in the manufacturing process (hereinafter, referred to as "target color characteristics").

To determine the type and amount of a wavelength conversion material required for the color compensation of the light emitting structures 120, it may be determined whether or not the previously measured color characteristics correspond to the target color characteristics. When the previously measured color characteristics conform to the target color characteristics, it may be determined that the wavelength conversion regions 182 are formed by filling the recesses 181 of the light transmissive substrate 180 with the wavelength conversion material in a standard amount for converting the light emitted from the light emitting structures 120 into white light.

When the previously measured color characteristics do not conform to the target color characteristics, a type or an amount of a wavelength conversion material may be adjusted, so that the light emitted from the light emitting structures 120 is converted into light having target color characteristics after passing through the wavelength conversion material.

The type and amount of a wavelength conversion material may be determined by quantifying a rate of change of color characteristics with respect to the type and amount of the wavelength conversion material and calculating the type and amount of a wavelength conversion material required based on the change rate of the color characteristics.

For example, when a wavelength of light measured is relatively short with respect to the target color characteristics, an amount of phosphors or quantum dots per unit volume of the wavelength conversion material capable of increasing wavelength of light may be increased or depths of the recesses 181 may be increased in the light transmissive substrate 180, so as to convert the light emitted from the light emitting structures 120 into light having a longer wavelength. The amount of the wavelength conversion material may be controlled by adjusting the depths of the recesses 181 in the light transmissive substrate 180, and the type of the wavelength conversion material may be controlled by changing types of phosphors or quantum dots and increasing or decreasing a mixing ratio thereof.

Therefore, by changing the shapes of the recesses 181 formed in the light transmissive substrate 180 and the type and amount of a wavelength conversion material filling the recesses 181, the wavelength conversion regions 182 allowing for the emission of light satisfying the target color characteristics may be formed.

FIG. 16 illustrates the arrangement of the wavelength conversion regions 182, according to the measured color characteristics of the plurality of light emitting structures 120 manufactured on a single wafer. As illustrated in FIG. 16, similar wavelength conversion regions 182 are distributed in regions C1 to C4 based on concentric circles. The distribution is because the growth of the plurality of light emitting structures 120 to be manufactured on a single wafer is different due to differences in temperature, supply gas flow, and the like, during the manufacturing processes, and accordingly, they differ in terms of a wavelength of light, an amount of light, and the like. In an embodiment, while the wafer is rotated at high speed during the injecting of supply gas, the concentration of the supply gas may differ based on concentric circles.

According to an exemplary embodiment, the most appropriate wavelength conversion regions 182 may be provided to respective light emitting structures 120 having different color characteristics, and thus, the resultant color characteristics may be improved.

Since the light transmissive substrate 180 has light transmissive properties, the light emitted from the light emitting structure 120 may pass through the light transmissive substrate 180, and may serve as a protective layer encapsulating the wavelength conversion regions 182. Since the light transmissive substrate 180 is bonded to the light emitting structures 120, the effect of preventing moisture permeation may be expected.

The light transmissive substrate 180 has a certain degree of hardness sufficient to firmly support the light emitting structures 120 during the separation of the support substrate 160, and thus it may be used as a support body in separating the support substrate 160. Therefore, a separate support body may not be necessary in removing the support substrate 160.

The plurality of light transmissive substrates may be stacked, and details thereof will be provided with respect to another exemplary embodiment in the present disclosure.

In an embodiment, the other surface of the light transmissive substrate 180 opposing one surface thereof to which the light emitting structures 120 are bonded may be processed through micromachining using a chemical mechanical polishing (CMP) method, thereby forming a thin light transmissive substrate 180a. However, the present operation is not limited thereto, and a portion of the other surface of the light transmissive substrate 180 may be chemically etched or the process of thinning the light transmissive substrate 180 may be omitted if the light transmissive substrate 180 is sufficiently thin. This operation reduces the thickness of the light transmissive substrate 180, thereby improving light extraction efficiency and reducing damage to the light transmissive substrate 180 that may be caused during a subsequent separation process of individual semiconductor light emitting device packages 100.

In an embodiment, an uneven structure may be formed on the light transmissive substrate 180, whereby the light extraction efficiency may be further improved. Such an uneven structure may be formed by performing wet etching or plasma-based dry etching on the surface of the light transmissive substrate 180.

Figure 6:
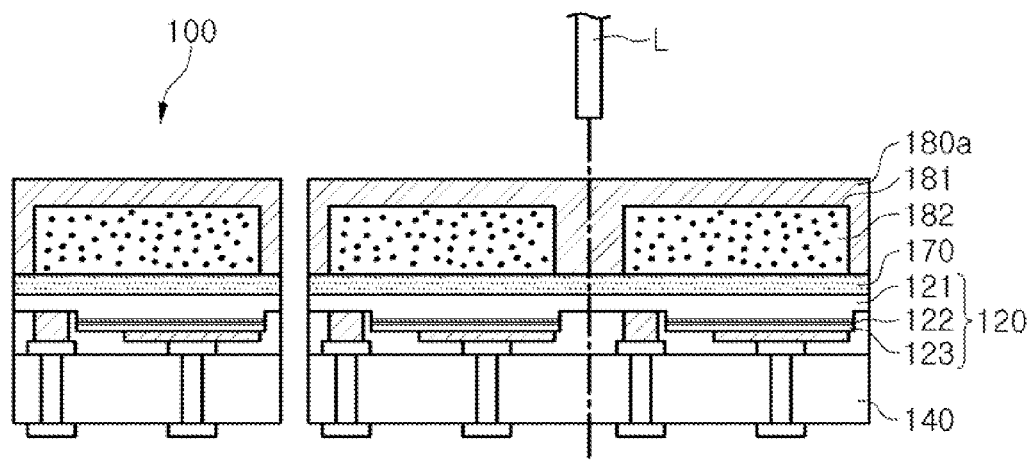

Then, as illustrated in FIG. 6, the light transmissive substrate 180, the light emitting structures 120 and the package substrate 140 may be cut using a laser beam L and individual semiconductor light emitting device packages 100 may be separated from one another. At this time, the cutting process may be performed to separate the plurality of wavelength conversion regions 182 formed in the light transmissive substrate 180 from one another. However, the method of separating the semiconductor light emitting device packages 100 is not limited thereto, and a separation method using a blade or a water jet may be employed.

Hereinafter, a method of manufacturing a semiconductor light emitting device package according to another exemplary embodiment in the present disclosure will be described. FIGS. 7 through 12 are schematic views illustrating sequential processes in a method of manufacturing a semiconductor light emitting device package according to another exemplary embodiment in the present disclosure, and FIG. 13 illustrates a modified example of the exemplary embodiment illustrated in FIGS. 7 through 12.

In an embodiment, the color characteristics of light emitting structures 220 are not measured prior to bonding a light transmissive substrate 280 thereto. The light emitting structures 220 in the present exemplary embodiment are inserted into recesses 281 formed in the light transmissive substrate 280. The present exemplary embodiment will be described on the basis of the aforementioned differences.

Figure 7:
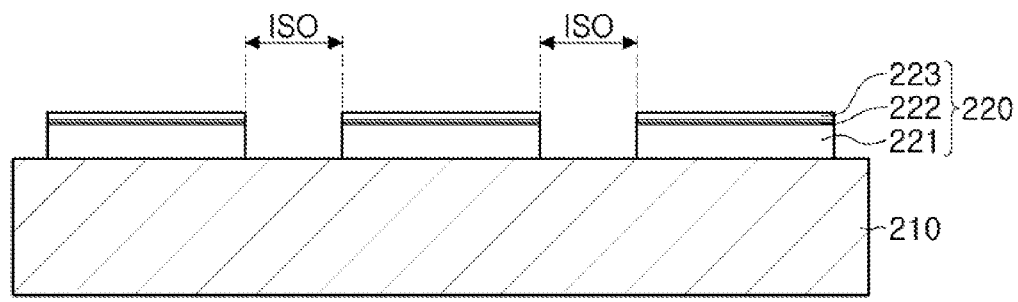
FIGS. 7, 8, 9, 10, 11 and 12 are schematic views illustrating sequential processes in a method of manufacturing a semiconductor light emitting device package according to another exemplary embodiment in the present disclosure.

Referring to FIG. 7, a light emitting structure 220 including a first conductivity-type semiconductor layer 221, an active layer 222 and a second conductivity-type semiconductor layer 223 may be formed on a support substrate 210. The support substrate 210 may be a growth substrate for growing the light emitting structure 220.

However, unlike the mesa-etched surface M formed in the region of the light emitting structure 120 in the previous exemplary embodiment, a region of the light emitting structure 220 may be etched to expose a corresponding portion of the support substrate 210, thereby forming a device isolation region (ISO).

Figure 8:
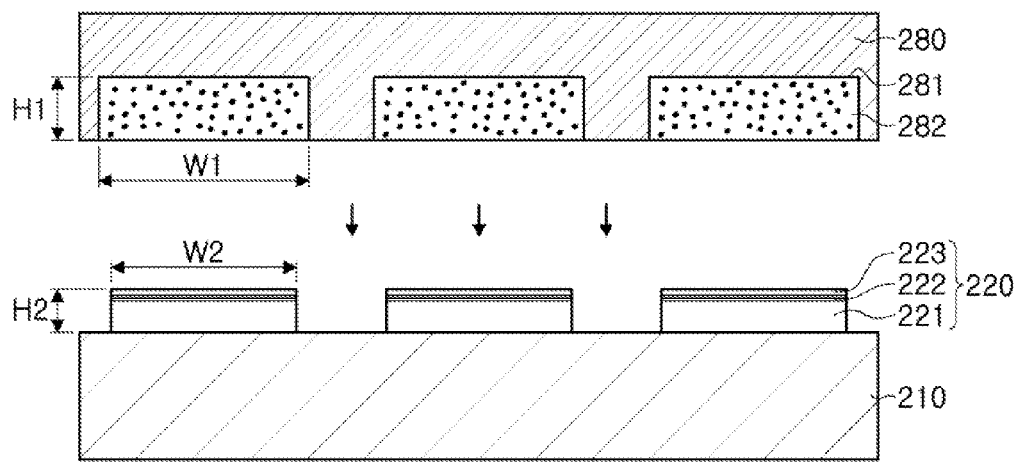
Figure 9:
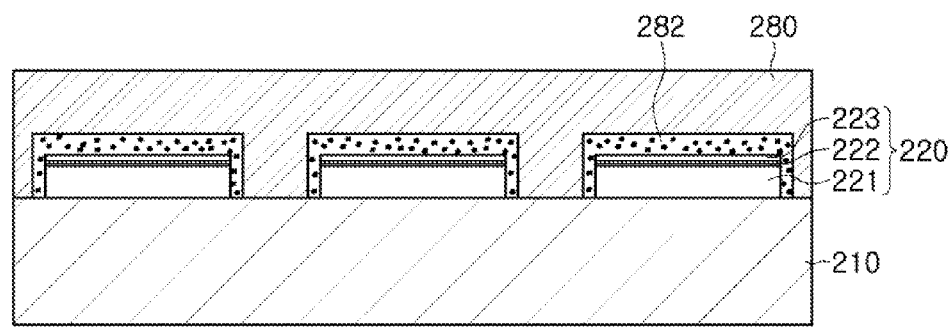

Referring to FIGS. 8 and 9, the light transmissive substrate 280 may be bonded to the support substrate 210.

In an embodiment, the color characteristics of individual light emitting structures 120 may be measured and then the wavelength conversion regions 182 may be formed in light of the measured color characteristics. In an exemplary embodiment, wavelength conversion regions 282 may be formed in the light transmissive substrate 280 without measuring the color characteristics of the light emitting structures 220.

The recesses 281 of the light transmissive substrate 280 for the wavelength conversion regions 282 may have the same shape, and may be filled with the same type and the same amount of a wavelength conversion material. However, the formation of the wavelength conversion regions 282 is not limited thereto. For example, the shapes of the recesses 281 and the type and amount of a wavelength conversion material appropriate for converting light emitted from the light emitting structures 220 may be predicted on the basis of the results of statistics through preliminary research in manufacturing processes, and the wavelength conversion regions 282 may be formed on the basis of the predicted results.

A width W1 and a depth H1 of the recess 281 formed in the light transmissive substrate 280 may be greater than a width W2 and a height H2 of the light emitting structure 220. Therefore, when the wavelength conversion regions 282 formed in the light transmissive substrate 280 and the light emitting structures 220 formed on the support substrate 210 are arranged to correspond to one another and are bonded to one another, the light emitting structures 220 may be inserted into the wavelength conversion regions 282, respectively, as illustrated in FIG. 9.

Figure 10:
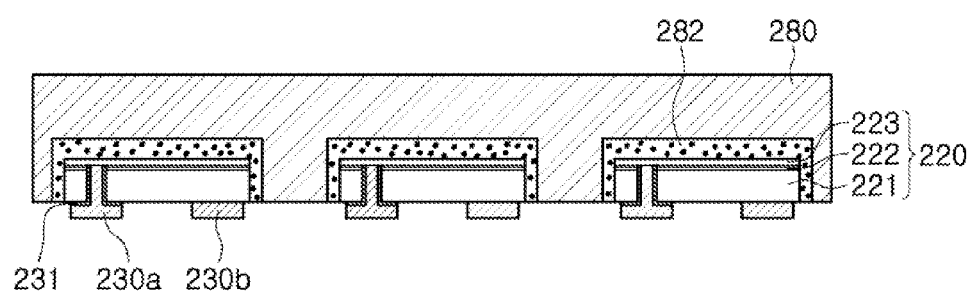

Referring to FIG. 10, the support substrate 210 may be separated from the light emitting structures 220, and first and second electrodes 230a and 230b may be formed on the bottom of the light emitting structures 220.

As described above, the light transmissive substrate 280 has a degree of hardness sufficient to allow the light emitting structures 220 to be firmly supported during the separation of the support substrate 210, and thus a separate support body is not necessary in removing the support substrate 210. Therefore, the simplicity of the manufacturing process may be achieved.

The support substrate 210 may be separated from the light emitting structures 220 through an LLO process, and may be removed by a physical method such as grinding, polishing, lapping, or the like.

The method of forming the first and second electrodes 230a and 230b on the bottom of the light emitting structure 220 will be described in detail. First, in order to form the first electrode 230a, a via hole may be formed to penetrate through the second conductivity-type semiconductor layer 221 and the active layer 222 by performing an etching process using a mask, and then an insulating layer 231 may be formed. Then, a conductive ohmic-contact material may be deposited on the bottom of the light emitting structure 220, thereby forming the first and second electrodes 230a and 230b. At this time, the first and second electrodes 230a and 230b may be formed of various materials or may have a multilayer structure so as to improve ohmic-contact or reflective characteristics.

After forming the first and second electrodes 230a and 230b, at least one light transmissive substrate may be further stacked on the light transmissive substrate 280. Details thereof will be provided below with reference to a modified example.

Figure 11:
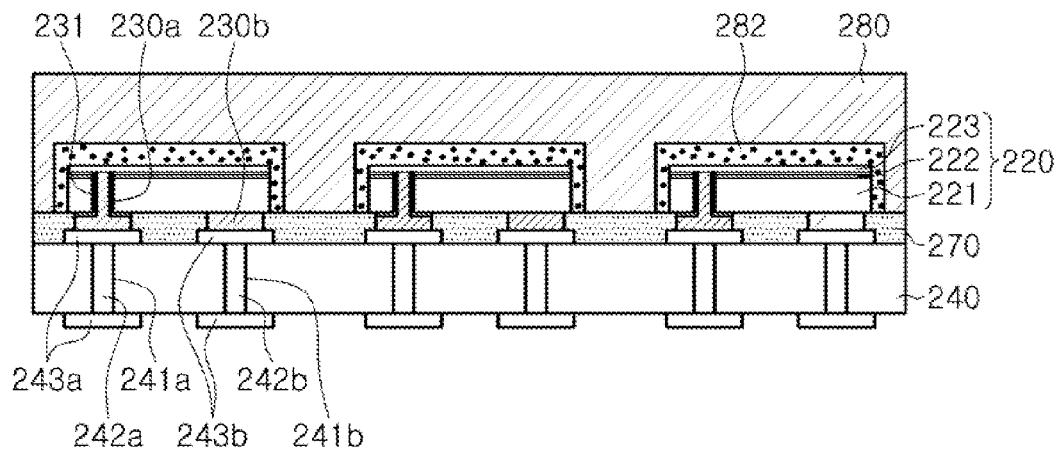

Referring to FIG. 11, a package substrate 240 may be bonded to the light emitting structures 220. Prior to the bonding of the package substrate 240, an adhesive 270 may be applied to the bottom of the light transmissive substrate 280 and the light emitting structures 220. First and second bonding pads 243a and 243b may be formed on the package substrate 240. By electrically connecting the first and second electrodes 230a and 230b to the first and second bonding pads 243a and 243b, the light emitting structures 220 may be mounted on the package substrate 240. The first and second electrodes 230a and 230b may be electrically connected to the first and second bonding pads 243a and 243b using a conductive adhesive such as solder bumps or the like, but the connections thereof are not limited thereto.

In an embodiment, first and second via electrodes 242a and 242b may be formed to penetrate through the package substrate 240 from one surface of the package substrate 240 to the other surface thereof in a thickness direction, thereby making electrical connections with the first and second electrodes 230a and 230b. The first and second via electrodes 242a and 242b may be formed by bonding the package substrate 240 to the light emitting structures 220, forming first and second via holes 241a and 241b penetrating through one surface and the other surface of the package substrate 240, and filling the first and second via holes 241a and 241b with a conductive paste. Alternatively, the first and second via electrodes 242a and 242b may be formed by plating the first and second via holes 241a and 241b with a conductive material. However, the formation of the first and second via electrodes is not limited thereto, and the first and second via electrodes 242a and 242b may be formed and bonded prior to bonding the package substrate 240 to the light emitting structures 220.

Figure 12:
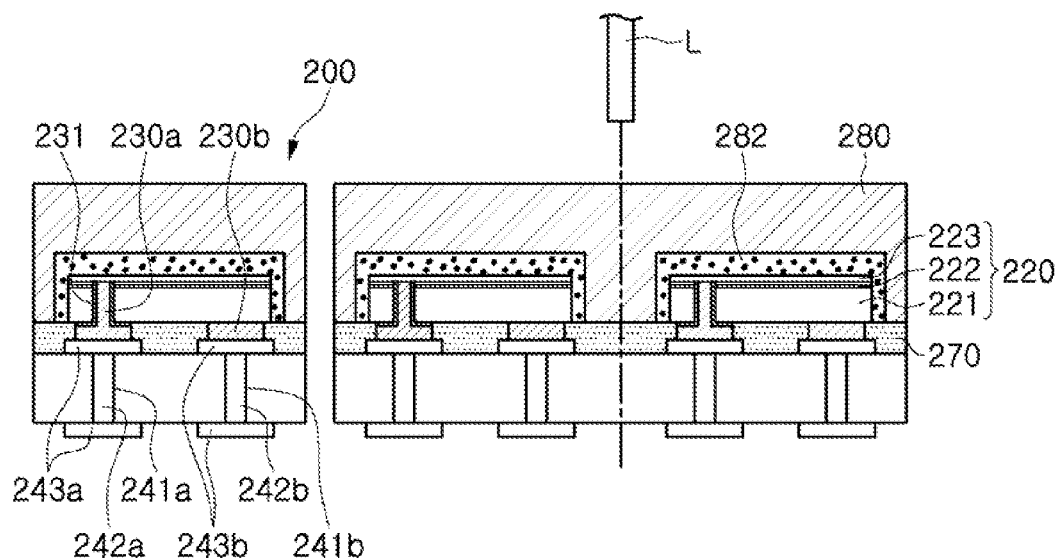
Figure 13:
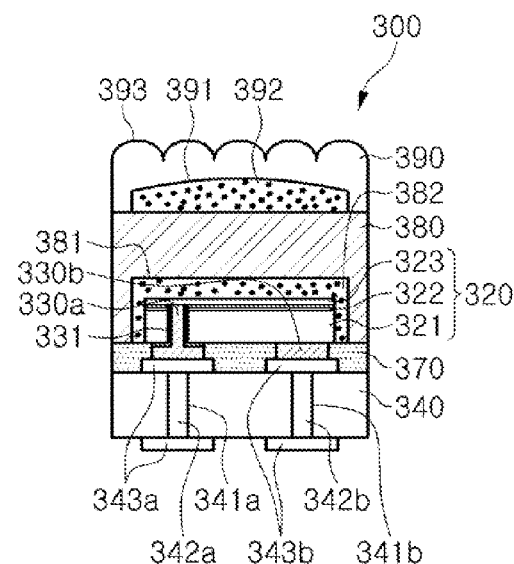
FIG. 13 illustrates a modified example of the exemplary embodiment illustrated in FIGS. 7 through 12.

Then, as illustrated in FIG. 12, the light transmissive substrate 280 and the package substrate 240 may be cut using a laser beam L and individual semiconductor light emitting device packages 100 may be separated from one another. At this time, the cutting process may be performed to separate the plurality of wavelength conversion regions 282 formed in the light transmissive substrate 280 from one another. However, the method of separating the semiconductor light emitting device packages 200 is not limited thereto, and a separation method using a blade or a water jet may be employed.

Hereinafter, a modified example of the exemplary embodiment illustrated in FIGS. 7 through 12 will be described. FIG. 13 illustrates a modified example of the exemplary embodiment illustrated in FIGS. 7 through 12.

A semiconductor light emitting device package 300 in the modified example may include a light emitting structure 320 having first and second conductivity-type semiconductor layers 321 and 323 and an active layer 322. In an embodiment, first and second electrodes 330a and 330b and an insulating layer 331 may be formed on the first and second conductivity-type semiconductor layers 321 and 323.

A package substrate 340 may be bonded to the bottom of the light emitting structure 320. First and second bonding pads 343a and 343b may be formed on the package substrate 340. By electrically connecting the first and second electrodes 330a and 330b to the first and second bonding pads 343a and 343b, the light emitting structures 320 may be mounted on the package substrate 340. Prior to the bonding of the package substrate 340, an adhesive 370 may be applied to the bottom of the light transmissive substrate 380 and the light emitting structures 320.

In an embodiment, first and second via electrodes 342a and 342b may be formed to penetrate through the package substrate 340 from one surface of the package substrate 340 to the other surface thereof in a thickness direction, thereby making electrical connections with the first and second electrodes 330a and 330b.

A plurality of light transmissive substrates 380 and 390 may be bonded to the light emitting structures 320, wherein an uneven structure 393 may be formed on an exposed top surface of the light transmissive substrate 390, whereby light extraction efficiency may be further improved. Such an uneven structure may be formed by performing wet etching or plasma-based dry etching on the surface of the light transmissive substrate 390. Here, recesses 381 and 391 formed in the light transmissive substrates 380 and 390 for wavelength conversion regions 382 and 392, respectively, may have different shapes and may be filled with different types and amounts of a wavelength conversion material.

Prior to stacking the light transmissive substrate 390, the color characteristics of the light emitting structures 320 may be measured, and a type and an amount of a wavelength conversion material required for color compensation of the light emitting structures 320 may be determined based on a difference between the measured color characteristics and color characteristics targeted in the manufacturing process. The wavelength conversion region 392 of the light transmissive substrate 390 may be determined on the basis of the type and amount of a wavelength conversion material determined.

The semiconductor light emitting device packages according to the exemplary embodiments in the present disclosure may be usefully applied to various products.

Figure 19:
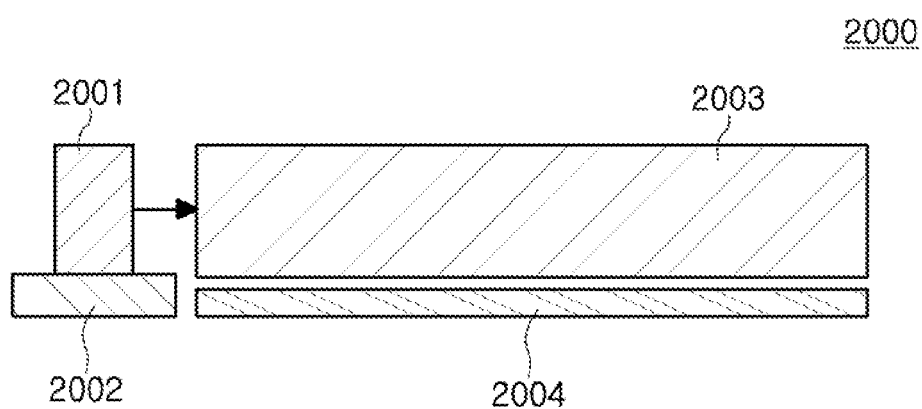

FIGS. 18 and 19 illustrate examples of a backlight unit to which a semiconductor light emitting device package according to an exemplary embodiment in the present disclosure is applied.

With reference to FIG. 18, a backlight unit 1000 may include at least one light source 1001 mounted on a substrate 1002 and at least one optical sheet 1003 disposed thereabove. The semiconductor light emitting device packages according to the above-described exemplary embodiments may be used as the light source 1001.

The light source 1001 in the backlight unit 1000 of FIG. 18 emits light toward a liquid crystal display (LCD) device disposed thereabove, whereas a light source 2001 mounted on a substrate 2002 in a backlight unit 2000 according to another embodiment illustrated in FIG. 19 emits light laterally, and the light is incident to a light guide plate 2003 such that the backlight unit 2000 may serve as a surface light source. The light travelling to the light guide plate 2003 may be emitted upwardly and a reflective layer 2004 may be disposed below the light guide plate 2003 in order to improve light extraction efficiency.

Figure 20:
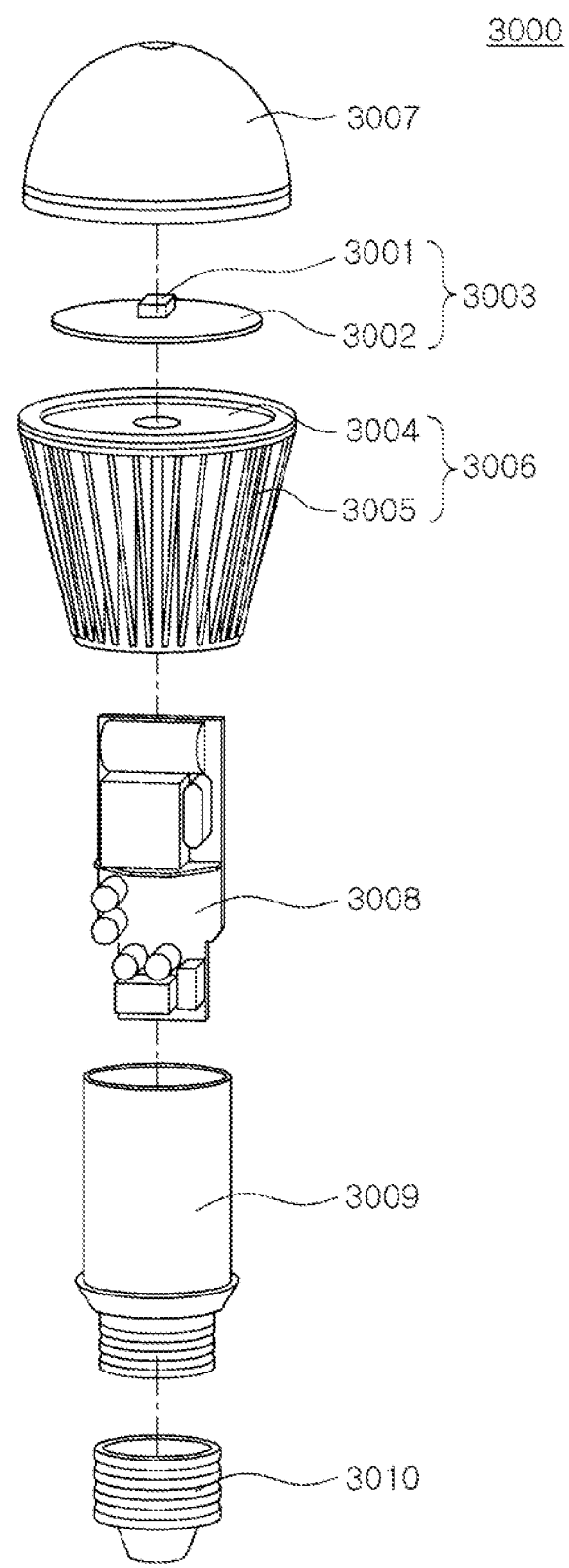
FIG. 20 illustrates an example of a lighting device to which a semiconductor light emitting device package according to an exemplary embodiment in the present disclosure is applied.

FIG. 20 is an exploded perspective view illustrating an example of a lighting device to which a semiconductor light emitting device package according to an exemplary embodiment in the present disclosure is applied.

A lighting device 3000 illustrated in FIG. 20 is a bulb-type lamp by way of example, and includes a light emitting module 3003, a driver 3008, and an external connector 3010.

In an embodiment, the lighting device 3000 may further include exterior structures such as external and internal housings 3006 and 3009, a cover 3007, and the like. The light emitting module 3003 may include a light source 3001 and a circuit board 3002 on which the light source 3001 is mounted. For example, the first and second electrodes of the above-described semiconductor light emitting device package may be electrically connected to electrode patterns of the circuit board 3002. In an exemplary embodiment, a single light source 3001 is mounted on the circuit board 3002 by way of example; however, a plurality of light sources may be mounted thereon as necessary.

The external housing 3006 may serve as a heat radiator and may include a heat sink plate 3004 directly contacting the light emitting module 3003 to thereby improve heat dissipation and heat radiating fins 3005 surrounding a lateral surface of the lighting device 3000. The cover 3007 may be disposed above the light emitting module 3003 and have a convex lens shape. The driver 3008 may be disposed inside the internal housing 3009 and be connected to the external connector 3010 such as a socket structure to receive power from an external power source. In addition, the driver 3008 may convert the received power into power appropriate for driving the light source 3001 of the light emitting module 3003 and supply the converted power thereto. For example, the driver 3008 may be provided as an AC-DC converter, a rectifying circuit part, or the like.

Figure 21:
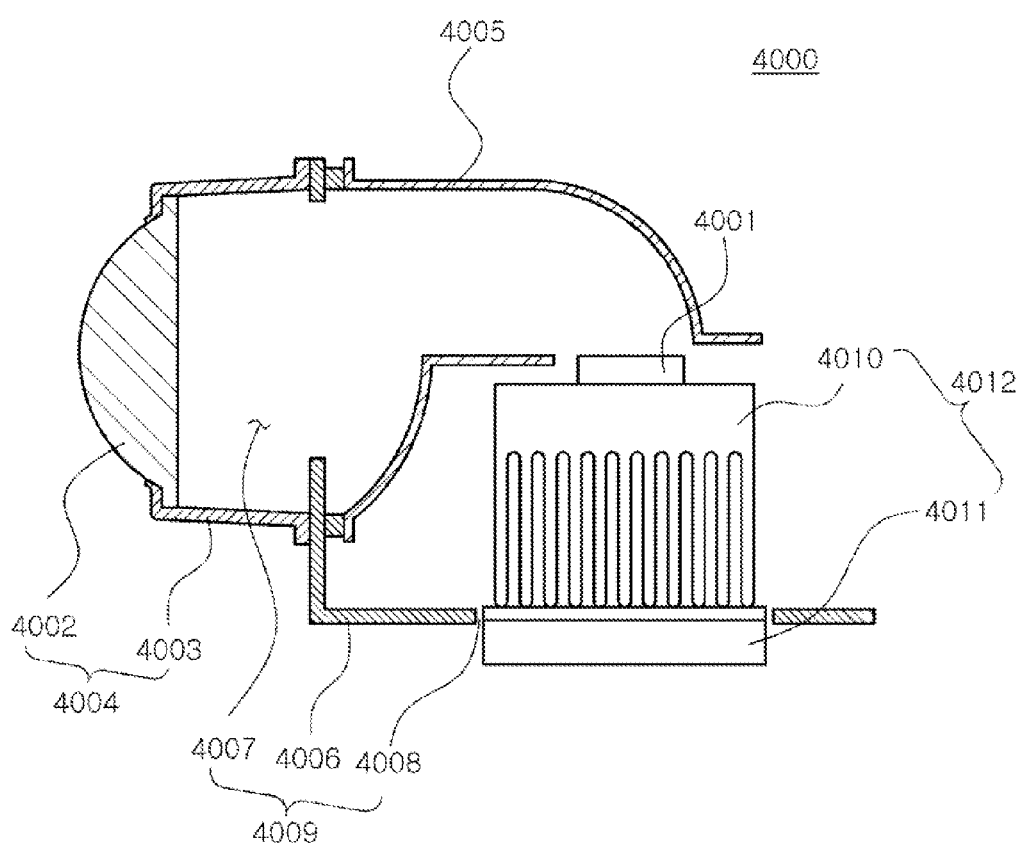
FIG. 21 illustrates an example of a headlamp to which a semiconductor light emitting device package according to an exemplary embodiment in the present disclosure is applied.

FIG. 21 illustrates an example of a headlamp to which a semiconductor light emitting device package according to an exemplary embodiment in the present disclosure is applied.

With reference to FIG. 21, a headlamp 4000 used in a vehicle or the like may include a light source 4001, a reflector 4005 and a lens cover 4004, and the lens cover 4004 may include a hollow guide part 4003 and a lens 4002. The semiconductor light emitting device packages according to the above-described exemplary embodiments may be used as the light source 4001.

The headlamp 4000 may further include a heat radiator 4012 dissipating heat generated by the light source 4001 outwardly. The heat radiator 4012 may include a heat sink 4010 and a cooling fan 4011 in order to effectively dissipate heat. In addition, the headlamp 4000 may further include a housing 4009 allowing the heat radiator 4012 and the reflector 4005 to be fixed thereto and supported thereby. The housing 4009 may include a body 4006 and a central hole 4008 formed in one surface thereof, to which the heat radiator 4012 is coupled.

The housing 4009 may include a forwardly open hole 4007 formed in the other surface thereof integrally connected to one surface thereof and bent in a direction perpendicular thereto. The reflector 4005 may be fixed to the housing 4009, such that light generated by the light source

4001 may be reflected by the reflector 4005, pass through the forwardly open hole 4007, and be emitted outwardly.

As set forth above, in a method of manufacturing a semiconductor light emitting device package according to exemplary embodiments in the present disclosure, a light transmissive substrate having wavelength conversion regions is used as a support substrate, whereby manufacturing time may be reduced.

While exemplary embodiments have been shown and described above, it will be apparent to those skilled in the art that modifications and variations could be made without departing from the scope of the invention as defined by the appended claims.

What is claimed is:

1. A method of manufacturing a semiconductor light emitting device package, the method comprising:
    arranging a plurality of light emitting structures on a support substrate, each light emitting structure including a first conductivity-type semiconductor layer, an active layer and a second conductivity-type semiconductor layer;
    bonding a flat surface of a light transmissive substrate to the plurality of light emitting structures, the light transmissive substrate having a plurality of wavelength conversion regions corresponding to the plurality of light emitting structures, respectively;
    removing the support substrate from the plurality of light emitting structures after bonding the flat surface of the light transmissive substrate to the plurality of light emitting structures; and
    separating individual semiconductor light emitting device packages from one another by removing at least a portion of the light transmissive substrate,
    wherein the plurality of wavelength conversion regions is formed by forming recesses in the light transmissive substrate in positions corresponding to positions of the plurality of light emitting structures and filling the recesses with a wavelength conversion material,
    the light transmissive substrate includes SiO2, and
    the wavelength conversion regions are formed by injecting a mixture comprising phosphor mixed with SiO2 particles into the recesses and sintering the mixture.

2. The method of claim 1, wherein the recesses are a polygonal cylindrical shape, a cylindrical shape, or a concave lens shape.

3. The method of claim 1, wherein the light transmissive substrate is thicker than one of the light emitting structures.

4. The method of claim 1, further comprising measuring color characteristics of light emitted from the plurality of light emitting structures prior to performing the arranging of the plurality of light emitting structures on the support substrate.

5. The method of claim 4, further comprising determining a type and an amount of the wavelength conversion material required for color compensation of the plurality of light emitting structures based on a difference between the measured color characteristics and target color characteristics and forming the plurality of wavelength conversion regions in the light transmissive substrate based on the determined type and the determined amount of the wavelength conversion material, prior to performing the bonding of the light transmissive substrate to the plurality of light emitting structures.

6. The method of claim 1, further comprising measuring color characteristics of light emitted from the plurality of light emitting structures prior to performing the separating of the individual semiconductor light emitting device packages from one another.

7. The method of claim 6, further comprising determining a type and an amount of the wavelength conversion material required for color compensation of the plurality of light emitting structures based on a difference between the measured color characteristics and target color characteristics and forming additional wavelength conversion regions on the light transmissive substrate based on the determined type and the determined amount of the wavelength conversion material, prior to performing the separating of the individual semiconductor light emitting device packages from one another.

8. The method of claim 7, wherein the forming of the additional wavelength conversion regions includes bonding a secondary light transmissive substrate having the additional wavelength conversion regions to the light transmissive substrate.

9. The method of claim 1, wherein the arranging of the plurality of light emitting structures on the support substrate includes:
    forming the plurality of light emitting structures on a growth substrate;
    forming first and second electrodes on a first surface of each light emitting structure corresponding to a surface of the second conductivity-type semiconductor layer, the first and second electrodes being connected to the first and second conductivity-type semiconductor layers, respectively;
    bonding the support substrate to the first surface of the plurality of light emitting structures; and
    removing the growth substrate from the plurality of light emitting structures.

10. The method of claim 9, further comprising bonding a package substrate to the first surface of the light emitting structure prior to performing the bonding of the support substrate, the package substrate having first and second via electrodes corresponding to the first and second electrodes, respectively.

11. The method of claim 1, wherein the arranging of the plurality of light emitting structures on the support substrate includes:
    growing the plurality of light emitting structures on the support substrate; and
    dividing the plurality of light emitting structures into individual light emitting structures by removing at least a portion of the light emitting structures.

12. A method of manufacturing a semiconductor light emitting device package, the method comprising:
    forming a plurality of light emitting structures on a growth substrate, each light emitting structure including a first conductivity-type semiconductor layer, an active layer and a second conductivity-type semiconductor layer;
    bonding a flat surface of a light transmissive substrate to the plurality of light emitting structures;
    removing the growth substrate from the plurality of light emitting structures after bonding the flat surface of the light transmissive substrate to the plurality of light emitting structures;
    forming first and second electrodes to be connected to the first and second conductivity-type semiconductor layers, respectively; and bonding a package substrate having first and second electrode structures connected to the first and second electrodes, respectively.

* * * * *